(12) United States Patent
Hebiguchi

(10) Patent No.: US 11,022,631 B2
(45) Date of Patent: Jun. 1, 2021

(54) CURRENT SENSOR

(71) Applicant: Alps Alpine Co., Ltd., Tokyo (JP)

(72) Inventor: Hiroyuki Hebiguchi, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 52 days.

(21) Appl. No.: 16/517,300

(22) Filed: Jul. 19, 2019

(65) Prior Publication Data

US 2019/0339307 A1 Nov. 7, 2019

Related U.S. Application Data

(63) Continuation of application No. PCT/JP2017/046565, filed on Dec. 26, 2017.

(30) Foreign Application Priority Data

Feb. 10, 2017 (JP) .............................. JP2017-023632

(51) Int. Cl.
*G01R 15/20* (2006.01)
*G01R 33/09* (2006.01)

(52) U.S. Cl.
CPC ........... *G01R 15/205* (2013.01); *G01R 33/09* (2013.01)

(58) Field of Classification Search
CPC .............................. G01R 33/09; G01R 15/205
See application file for complete search history.

(56) References Cited

U.S. PATENT DOCUMENTS

| | | | |
|---|---|---|---|
| 9,423,429 B2 * | 8/2016 | Fukui | G01R 33/09 |
| 9,435,829 B2 | 9/2016 | Hebiguchi et al. | |
| 9,958,482 B1 * | 5/2018 | Latham | G01R 15/205 |
| 10,120,041 B2 * | 11/2018 | Haas | G01R 33/075 |
| 2018/0038898 A1 | 2/2018 | Shimizu | |

* cited by examiner

*Primary Examiner* — Reena Aurora
(74) *Attorney, Agent, or Firm* — Brinks Gilson & Lione

(57) ABSTRACT

A conductor includes a first conductor portion, which is separated from a first imaginary flat plane on which a magnetoresistance effect element is disposed, and through which a current to be measured flows parallel to a first imaginary straight line, a second conductor portion, which intersects the first imaginary flat plane and through which the current to be measured flows parallel to a second imaginary straight line, a bent portion, which is disposed between the second conductor portion and the first conductor portion and is bent in a direction parallel to the first imaginary straight line from a direction parallel to the second imaginary straight line, and a third conductor portion disposed between the bent portion and the first conductor portion. The magnetic field due to the current to be measured flowing through the second conductor portion is perpendicular to the first imaginary flat plane.

7 Claims, 12 Drawing Sheets

CURRENT SENSOR

CLAIM OF PRIORITY

This application is a Continuation of International Application No. PCT/JP2017/046565 filed on Dec. 26, 2017, which claims benefit of priority to Japanese Patent Application No. 2017-023632 filed on Feb. 10, 2017. The entire contents of each application noted above are hereby incorporated by reference.

BACKGROUND

1. Field of the Disclosure

The present disclosure relates to a current sensor that measures a current by using a magneto-electric resistance effect element, such as a giant magnetoresistance (GMR) element or an anisotropic magnetoresistance (AMR) element.

2. Description of the Related Art

Differential-type current sensors configured to obtain a detection result of a current in accordance with differences between outputs from magnetic sensors are known in the art. Magnetic sensors detect magnetic fields due to currents flowing in opposite directions through a busbar bent into a U shape (for example, refer to Japanese Unexamined Patent Application Publications No. 2011-39021 and No. 2015-152418).

A magneto-electric resistance effect element, such as a GMR element or an AMR element, has a direction (sensitivity direction) of a magnetic field that causes a change in the resistance and a direction (influence-on-sensitivity direction) of a magnetic field that affects the detection sensitivity. The influence-on-sensitivity direction typically coincides with the direction of an internal bias magnetic field and is perpendicular to the sensitivity direction. If a magnetic field is applied from outside in the influence-on-sensitivity direction, the sensitivity changes because application of a magnetic field is equivalent to a change in the bias magnetic field. In the case of a differential-type current sensor described above, a magnetic field induced by a current flowing through a bottom part of a U-shaped portion has a component perpendicular to the sensitivity direction and thus affects the sensitivity of a magnetoresistance effect element.

Accordingly, the bottom part of the U-shaped portion of a current sensor illustrated in FIG. 13 in Japanese Unexamined Patent Application Publications No. 2011-39021 is subjected to bending processing. Because of this bending processing, the line connecting the center of the magnetic field due to a current flowing through the bottom part and the point where the magnetic field crosses a bias magnetic field for the magnetoresistance effect elements at right angles is likely to run in the direction of the bias magnetic field. Consequently, the magnetic field due to a current flowing through the bottom part is likely to cross the bias magnetic field at right angles, and the effect on the sensitivity is reduced.

FIG. 11 illustrates a configuration of a current sensor disclosed in Japanese Unexamined Patent Application Publications No. 2011-39021. FIG. 12 is a cross-sectional view taken along line XII-XII of FIG. 11. A U shape is formed by using plate-like conductors 103, 104, and 105 disposed between two plate-like conductors 101 and 102 running straight, and a sensor board 106 is disposed above the U-shaped portion. A current detecting device unit 107 including magnetoresistance effect elements is disposed on the sensor board 106.

The dotted line, to which an arrow is attached in FIG. 12, indicates the center of the distribution of a current to be measured Is. The current to be measured Is flows from one to the other of the two plate-like conductors 103 and 105, each of which runs like an arm, via the plate-like conductor 104. Even if the plate-like conductor 104, which is bent upward, is long in the upward direction, the center of the substantial current distribution CP of the current to be measured Is stays at a lower position, as illustrated in FIG. 12, because the current to be measured Is tends to flow along the shortest path. Thus, the center of a magnetic field Hs due to the current to be measured Is flowing through the plate-like conductor 104 (the center of the magnetic field Hs being the center of the current distribution CP) is located lower than the level at which the magnetic field Hs is perpendicular to the bias magnetic field for the magnetoresistance effect elements (the level indicated by the dot-dashed line in FIG. 12), and the difficulty that the magnetic field Hs affects the sensitivity of the magnetoresistance effect elements arises.

SUMMARY

A current sensor includes a conductor through which a current to be measured flows and a magnetoresistance effect element located on a first imaginary flat plane that is parallel to a first imaginary straight line and a second imaginary straight line. The conductor includes a first conductor portion that runs along the first imaginary straight line and that is separated from the first imaginary flat plane, and through which the current to be measured flows parallel to the first imaginary straight line, a second conductor portion that runs along the second imaginary straight line and that intersects the first imaginary flat plane, and through which the current to be measured flows parallel to the second imaginary straight line, a bent portion that is disposed along a current path between the second conductor portion and the first conductor portion and that is bent in a first direction parallel to the first imaginary straight line from a second direction parallel to the second imaginary straight line, and a third conductor portion that is disposed along a current path between the bent portion and the first conductor portion. The magnetoresistance effect element detects a magnetic field due to the current to be measured flowing through the first conductor portion. The direction of a magnetic field to which the magnetoresistance effect element has sensitivity and the direction of a magnetic field by which the sensitivity of the magnetoresistance effect element is influenced are parallel to the first imaginary flat plane, and the third conductor portion intersects the first imaginary flat plane.

In this configuration, while the first conductor portion is separated from the first imaginary flat plane, the magnetoresistance effect element, which detects the magnetic field due to the current to be measured flowing through the first conductor portion, is located on the first imaginary flat plane, and the second conductor portion intersects the first imaginary flat plane. Further, after bending at the bent portion and heading in the first direction parallel to the first imaginary straight line, the current to be measured flows through the first conductor portion via the third conductor portion, which intersects the first imaginary flat plane. Consequently, the center of the distribution of the current to be measured, which is separated from the first imaginary flat plane in the first conductor portion, can reach the vicinity of the first imaginary flat plane by passing through the third conductor portion. Since the center of the distribution of the current to be measured reaches the vicinity of the first imaginary flat plane after passing through the third conductor portion, the flow of the current to be measured, which bends at the bent portion, is centered around the first imaginary flat plane in the second conductor portion.

In this configuration, the magnetic field due to the current to be measured flowing through the second conductor portion is oriented to the direction perpendicular to the first imaginary flat plane, the direction being substantially perpendicular to the direction of the magnetic field that affects the sensitivity of the magnetoresistance effect element. Accordingly, the magnetic field due to the current to be measured flowing through the second conductor portion is unlikely to affect the sensitivity of the magnetoresistance effect element.

DESCRIPTION OF THE EXEMPLARY EMBODIMENTS

First Embodiment

Figure 1:
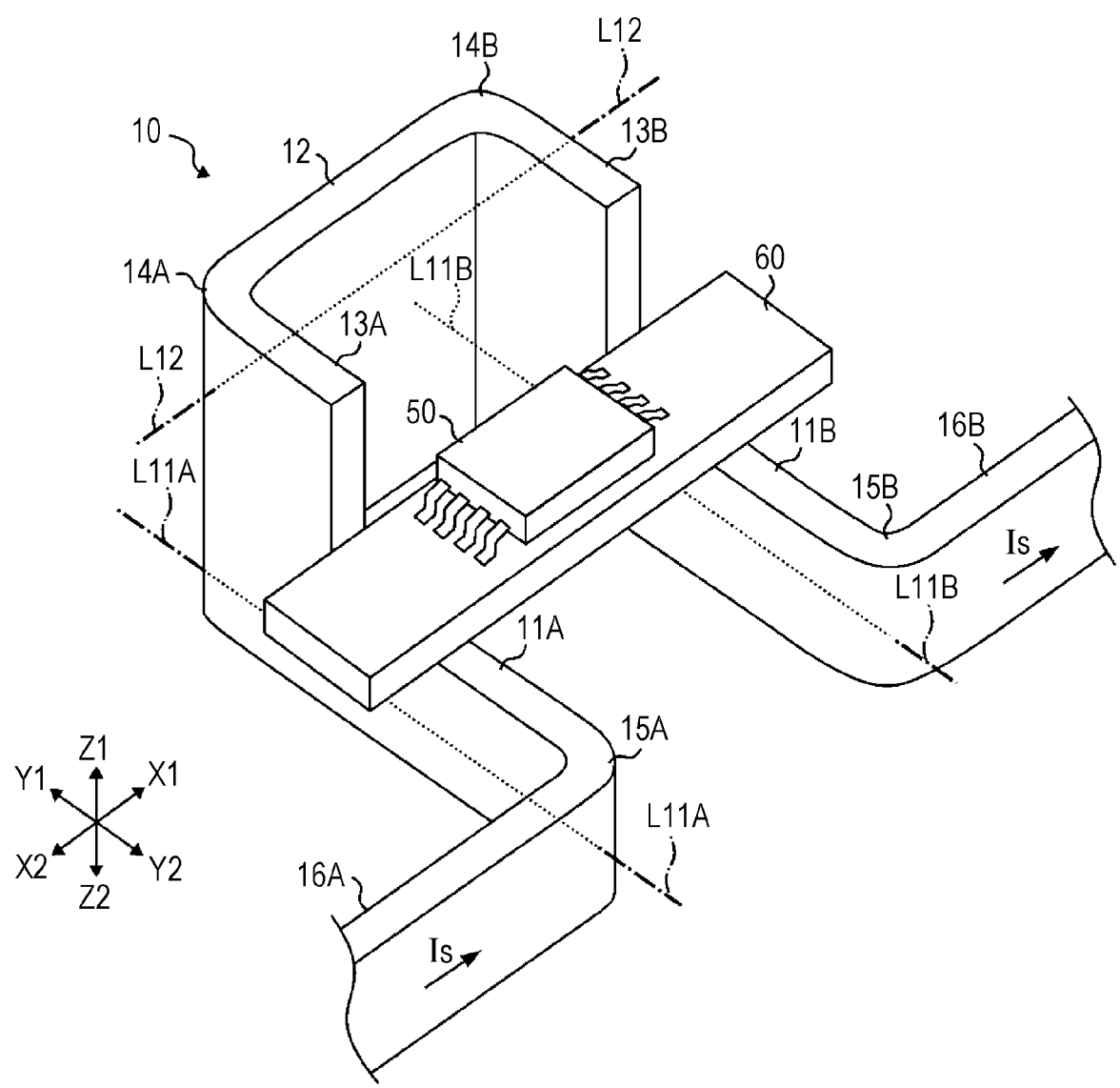
FIG. 1 illustrates an example configuration of a current sensor according to a first embodiment of the present invention.
Figure 2:
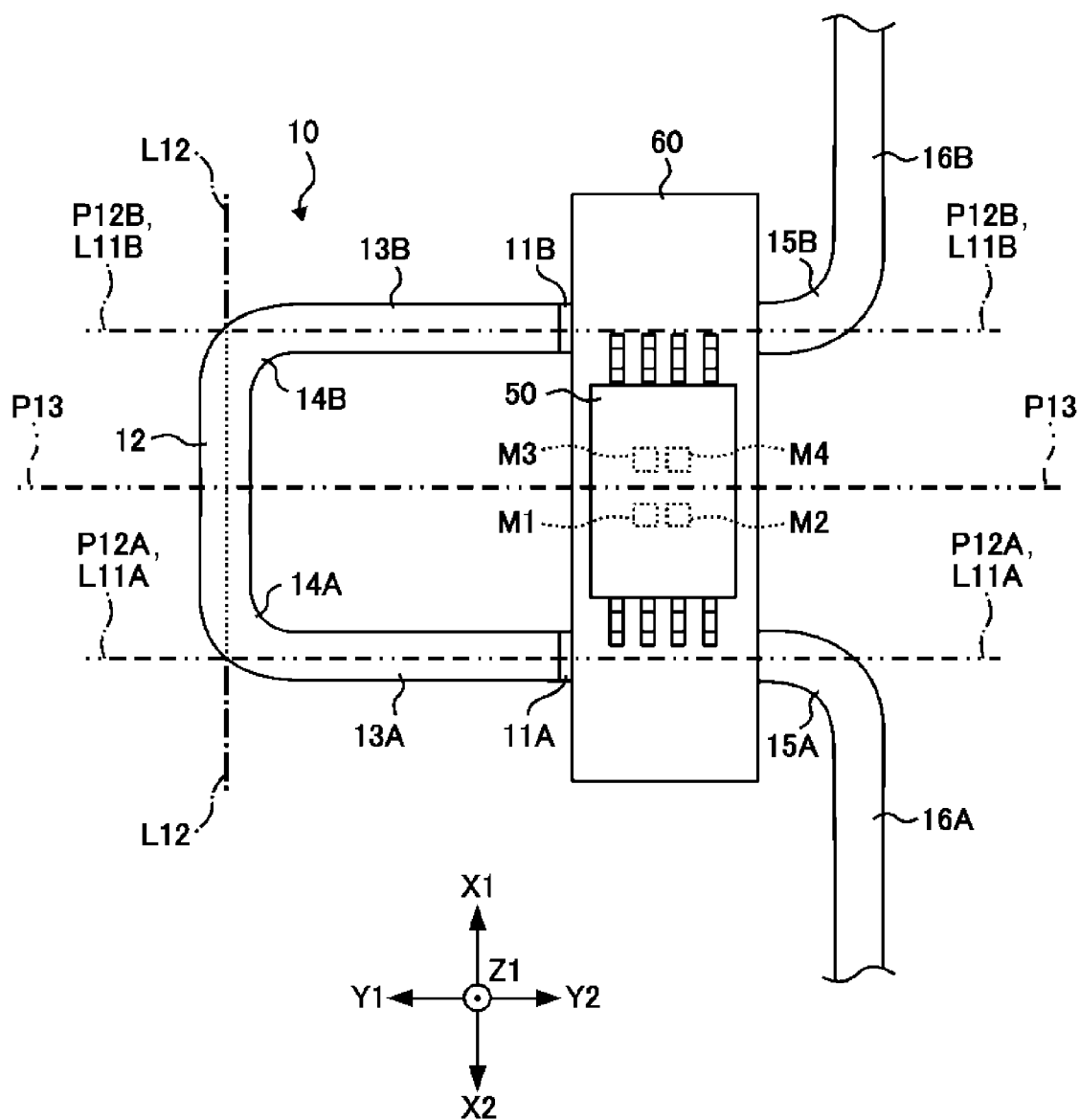
FIG. 2 is a plan view of the current sensor illustrated in FIG. 1.
Figure 3:
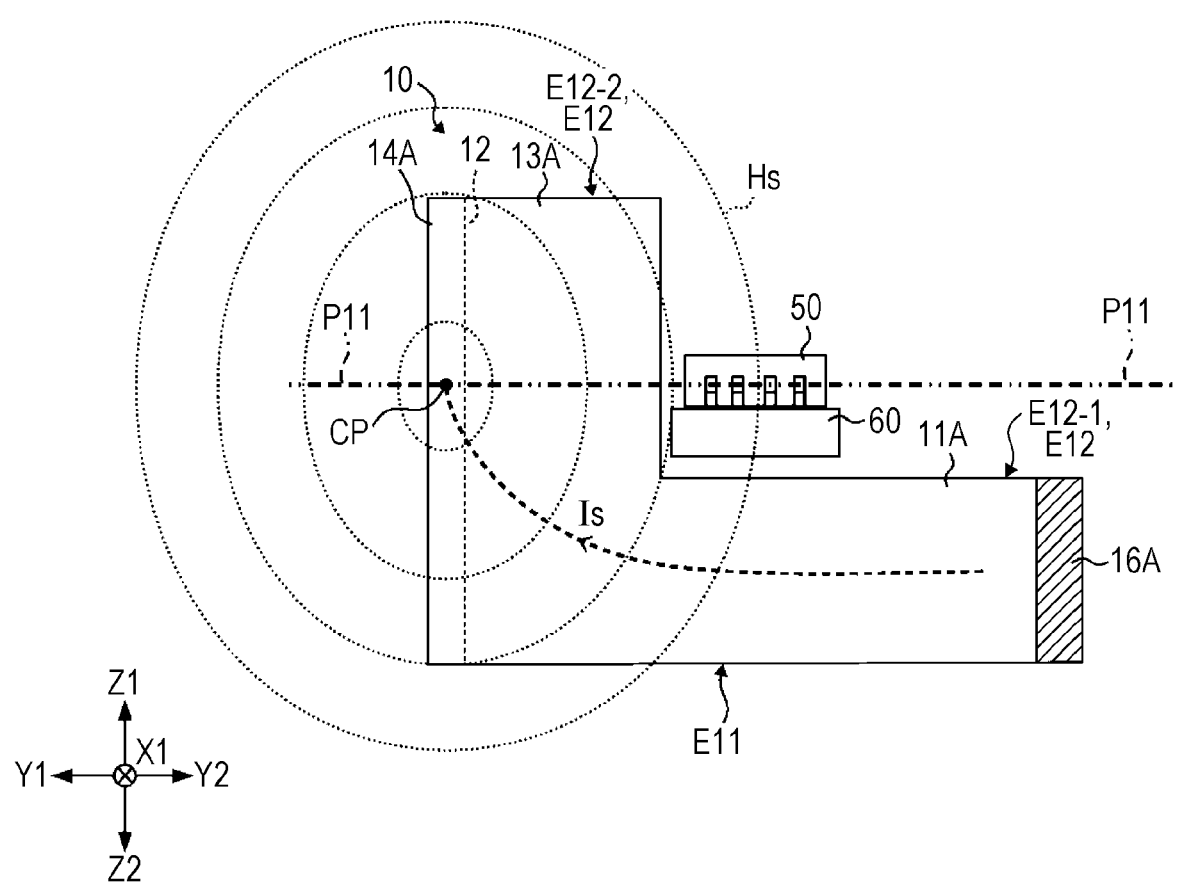
FIG. 3 is a front view of the current sensor illustrated in FIG. 1.

FIG. 1 illustrates an example configuration of a current sensor according to a first embodiment of the present invention. FIG. 2 is a plan view of the current sensor illustrated in FIG. 1 when viewed from the Z1 side. FIG. 3 is a front view of the current sensor illustrated in FIG. 1 when viewed from the X2 side. In the present specification, three directions perpendicular to each other are denoted by "X", "Y", and "Z". Opposite directions in the X direction are denoted by "X1" and "X2", opposite directions in the Y direction are denoted by "Y1" and "Y2", and opposite directions in the Z direction are denoted by "Z1" and "Z2".

The current sensor illustrated in FIG. 1 includes a conductor 10 made of metal or the like, a magnetic sensor 50 including magnetoresistance effect elements M1 to M4 that detect the magnetic field due to a current to be measured Is flowing through the conductor 10, and a circuit board 60 on which the magnetic sensor 50 is mounted. The conductor 10 and the circuit board 60 are fixed to each other by using an insulating support member (such as a mold member made of resin), which is not illustrated.

The conductor 10 is a bent plate-like member. For example, a plate-like material shaped by using processing such as blanking is subjected to bending processing, and the conductor 10 is formed. The conductor 10 is bent into a U shape as illustrated in FIG. 2 and has a plane symmetrical form about a third imaginary flat plane P13, which is parallel to the Y direction and the Z direction.

The conductor 10 has a first conductor portion 11A and a first conductor portion 11B, which are the two arms of the U-shaped bent form. The first conductor portion 11A runs along a first imaginary straight line L11A, which is parallel to the Y direction, and the first conductor portion 11B runs along a first imaginary straight line L11B, which is parallel to the Y direction. As illustrated in FIG. 1, the first conductor portion 11A and the first conductor portion 11B have a belt-like form that is thin in the X direction and that has an approximately uniform width in the Z direction. The first conductor portion 11A and the first conductor portion 11B are portions that are symmetrical to each other about the third imaginary flat plane P13. In the plan view in FIG. 2, the first conductor portion 11A is located on the X2 side, and the first conductor portion 11B is located on the X1 side. The current to be measured Is flows parallel to the first imaginary straight line L11A in the first conductor portion 11A and flows parallel to the first imaginary straight line L11B in the first conductor portion 11B.

The conductor 10 has a second conductor portion 12, which forms the bottom part of the U-shaped bent form. The second conductor portion 12 runs along a second imaginary straight line L12, which is parallel to the X direction. As illustrated in FIG. 1, the second conductor portion 12 has a belt-like form that is thin in the Y direction and that has an approximately uniform width in the Z direction. The second conductor portion 12 is wider than the first conductor portion 11A and the first conductor portion 11B in the Z direction. As illustrated in FIG. 2, the third imaginary flat plane P13 passes through the center of the second conductor portion 12 in the X direction.

As illustrated in FIG. 3, a first imaginary flat plane P11 is defined and located between the second imaginary straight line L12 and each of the first imaginary straight lines L11A and L11B. The first imaginary flat plane P11 is parallel to the first imaginary straight lines L11A and L11B and to the second imaginary straight line L12 (that is, parallel to the X direction and to the Y direction). The Z direction is perpendicular to the first imaginary flat plane P11 and corresponds to a third direction in the present invention. As illustrated in FIG. 3, the first conductor portion 11A and the first conductor portion 11B are separated from the first imaginary flat plane P11, and the second conductor portion 12 intersects the first imaginary flat plane P11. The angle between the first imaginary straight line L11A and the second imaginary straight line L12 and the angle between the first imaginary straight line L11B and the second imaginary straight line L12 are not necessarily equal to a right angle, as described below. However, neither the first imaginary straight line L11A nor the first imaginary straight line L11B is parallel to the second imaginary straight line L12.

The conductor 10 has a first bent portion 14A along the current path between the second conductor portion 12 and the first conductor portion 11A and has a first bent portion 14B along the current path between the second conductor portion 12 and the first conductor portion 11B. The first bent portion 14A bends in the Y2 direction (a first direction parallel to the first imaginary straight line L11A) from the X2 direction (a second direction parallel to the second imaginary straight line L12) at a substantially right angle, and the first bent portion 14B bends in the Y2 direction (the first direction, which is parallel to the first imaginary straight line L11B) from the X1 direction (a second direction parallel to the second imaginary straight line L12) at a substantially right angle. The width of the first bent portion 14A and the width of the first bent portion 14B in the Z direction are uniform and are equal to the width of the second conductor portion 12. The first bent portion 14A and the first bent portion 14B are portions that are symmetrical to each other about the third imaginary flat plane P13. The first bent portion 14A and the first bent portion 14B are an example bent portion in the present invention.

The conductor 10 has a third conductor portion 13A along the current path between the first bent portion 14A and the first conductor portion 11A and has a third conductor portion 13B along the current path between the first bent portion 14B and the first conductor portion 11B. Each of the third conductor portion 13A and the third conductor portion 13B intersects the first imaginary flat plane P11. As illustrated in FIG. 2, the third conductor portion 13A runs along a second imaginary flat plane P12A, which is perpendicular to the first imaginary flat plane P11 and contains the first imaginary straight line L11A. Further, the third conductor portion 13B runs along a second imaginary flat plane P12B, which is perpendicular to the first imaginary flat plane P11 and contains the first imaginary straight line L11B. The current to be measured Is flows parallel to the second imaginary flat plane P12A in the third conductor portion 13A. The current to be measured Is flows parallel to the second imaginary flat plane P12B in the third conductor portion 13B.

As illustrated in FIG. 1, the third conductor portion 13A and the third conductor portion 13B are thin in the X direction and have a uniform width in the Z direction. The width of the third conductor portion 13A and the width of the third conductor portion 13B in the Z direction are equal to the width of the first bent portion 14A, the width of the first bent portion 14B, and the width of the second conductor portion 12.

The conductor 10 has a cross section that is equal in shape and size and uniform in the portion ranging from the second conductor portion 12 to the third conductor portion 13A. Specifically, the cross section perpendicular to the X direction at the portion connecting the second conductor portion 12 and the first bent portion 14A, the cross section perpendicular to the Y direction at the portion connecting the first bent portion 14A and the third conductor portion 13A, and the cross section of the second conductor portion 12, the cross section being perpendicular to the X direction, are equal to each other in shape and size and uniform and all have a rectangular shape elongated in the Z direction. Similarly to the above case, the conductor 10 also has a cross section that is equal in shape and size and uniform in the portion ranging from the second conductor portion 12 to the third conductor portion 13B.

The conductor 10 has a fourth conductor portion 16A and a fourth conductor portion 16B, through which the current to be measured Is is input to and output from the U-shaped bent portion. The fourth conductor portion 16A and the fourth conductor portion 16B have a belt-like form that is thin in the Y direction and that has a uniform height in the Z direction, and each run in the X direction. The fourth conductor portion 16A is connected to the first conductor portion 11A via a second bent portion 15A, and the fourth conductor portion 16B is connected to the first conductor portion 11B via a second bent portion 15B.

In the example in FIG. 1, the magnetic sensor 50 is a packaged integrated circuit (IC), in which magnetoresistance effect elements M1 to M4, such as GMR elements and AMR elements, are included. As illustrated in FIG. 2, the magnetoresistance effect elements M1 and M3 are paired and disposed symmetrically about the third imaginary flat plane P13, and the magnetoresistance effect elements M2 and M4 are paired and disposed symmetrically about the third imaginary flat plane P13. The magnetoresistance effect elements M1 and M2 are disposed on the X2 side and detect the magnetic field due to the current to be measured Is flowing through the first conductor portion 11A. The magnetoresistance effect elements M3 and M4 are disposed on the X1 side and detect the magnetic field due to the current to be measured Is flowing through the first conductor portion 11B.

Figure 4:
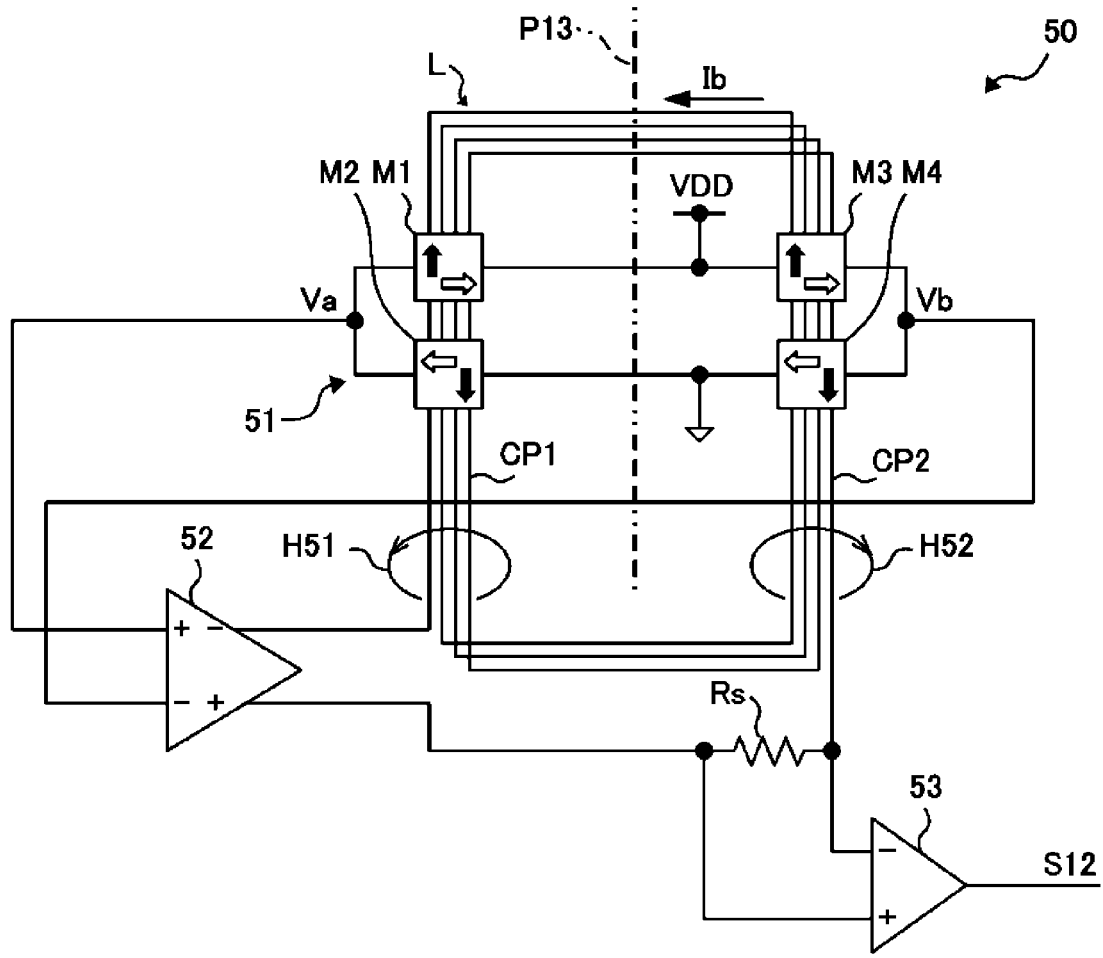
FIG. 4 illustrates an example configuration of a magnetic sensor.
Figure 4:
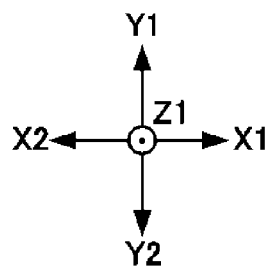

FIG. 4 illustrates an example configuration of the magnetic sensor 50. The magnetic sensor 50, which is illustrated in the example in FIG. 4, includes a bridge circuit 51 in which the magnetoresistance effect elements M1 to M4 are included, a coil L, a coil driver circuit 52, a differential amplifier 53, and a resistor Rs.

One end of the magnetoresistance effect element M1 is connected to a power supply voltage VDD, the other end of the magnetoresistance effect element M1 is connected to one end of the magnetoresistance effect element M2, and the other end of the magnetoresistance effect element M2 is grounded. One end of the magnetoresistance effect element M3 is connected to the power supply voltage VDD, the other end of the magnetoresistance effect element M3 is connected to one end of the magnetoresistance effect element M4, and the other end of the magnetoresistance effect element M4 is grounded. A voltage Va is generated at the node between the magnetoresistance effect elements M1 and M2, and a voltage Vb is generated at the node between the magnetoresistance effect elements M3 and M4.

In FIG. 4, white arrows indicate the sensitivity directions of the magnetoresistance effect elements, and black arrows indicate the influence-on-sensitivity directions of the magnetoresistance effect elements. The magnetoresistance effect elements M1 and M3 have the sensitivity direction in the X1 direction and the influence-on-sensitivity direction in the Y1 direction. The magnetoresistance effect elements M2 and M4 have the sensitivity direction in the X2 direction and the influence-on-sensitivity direction in the Y2 direction. The resistance of each of the magnetoresistance effect elements M1 to M4 decreases as the magnetic field in the sensitivity direction increases and increases as the magnetic field in the sensitivity direction decreases.

The coil L generates magnetic fields to cancel out the magnetic fields in the X direction that are induced at positions of the magnetoresistance effect elements M1 to M4 by the current to be measured Is in the first conductor portion 11A and in the first conductor portion 11B. As illustrated in FIG. 4, for example, the coil L produces a current path CP1 running in the Y direction in the vicinity of the magnetoresistance effect elements M1 and M2. When a current Ib flows in the Y2 direction along the current path CP1, a magnetic field H51 is generated in the X2 direction in the vicinity of the magnetoresistance effect elements M1 and M2. The magnetic field H51 cancels out the components in the X1 direction of the magnetic fields that are induced at the positions of the magnetoresistance effect elements M1 and M2 by the current to be measured Is in the first conductor portion 11A. Similarly, the coil L produces a current path CP2 running in the Y direction in the vicinity of the magnetoresistance effect elements M3 and M4. When the current Ib flows in the Y1 direction along the current path CP2, a magnetic field H52 is generated in the X1 direction in the vicinity of the magnetoresistance effect elements M3 and M4. The magnetic field H52 cancels out the components in the X2 direction of the magnetic fields that are induced at the positions of the magnetoresistance effect elements M3 and M4 by the current to be measured Is in the first conductor portion 11B.

The coil driver circuit 52 passes the current Ib through the coil L in accordance with the difference between the voltages Va and Vb of the bridge circuit 51.

When no magnetic field is present, the magnetoresistance effect elements M1 to M4 are assumed to have approximately equal resistances. In this case, when the current to be measured Is becomes null, the voltages Va and Vb become approximately equal. When the current to be measured Is flows from the fourth conductor portion 16A to the fourth conductor portion 16B, the magnetic field in the X direction due to the current to be measured Is causes the resistances of the magnetoresistance effect elements M1 to M4 to change, and the voltage Va exceeds the voltage Vb. When the voltage Va is higher than the voltage Vb, the coil driver circuit 52 outputs the current Ib so that the current Ib flows in the Y2 direction along the current path CP1 and flows in the Y1 direction along the current path CP2. The coil driver circuit 52 increases the current Ib as the difference between the voltages Va and Vb increases. In the vicinity of the magnetoresistance effect elements M1 to M4, the magnetic field in the X direction induced by the current Ib of the coil L exerts an effect to cancel out the component in the X direction of the magnetic field induced by the current to be measured Is. Thus, an increase in the voltage Va relative to the voltage Vb is prevented or reduced.

In contrast to the above case, when the current to be measured Is flows from the fourth conductor portion 16B to the fourth conductor portion 16A, the voltage Va becomes lower than the voltage Vb. When the voltage Va is lower than the voltage Vb, the coil driver circuit 52 outputs the current Ib so that the current Ib flows in the Y1 direction along the current path CP1 and flows in the Y2 direction along the current path CP2. The coil driver circuit 52 increases the current Ib as the difference between the voltages Va and Vb increases. In the vicinity of the magnetoresistance effect elements M1 to M4, the magnetic field in the X direction induced by the current Ib of the coil L exerts an effect to cancel out the component in the X direction of the magnetic field induced by the current to be measured Is. Thus, a decrease in the voltage Va relative to the voltage Vb is prevented or reduced.

The coil driver circuit 52 has a sufficiently large gain, which is the ratio of the current Ib that is output to the coil L to the voltage (Va−Vb) that is input from the bridge circuit 51. Thus, the voltages Va and Vb of the bridge circuit 51 become approximately equal because of feedback operation. Consequently, the component in the X direction of the magnetic field due to the current to be measured Is and the magnetic field in the X direction due to the current Ib of the coil L are approximately equal at each of the positions of the magnetoresistance effect elements M1 to M4.

The resistor Rs is inserted in the current path of the coil L. The differential amplifier 53 amplifies a voltage that is generated between both ends of the resistor Rs by the current Ib flowing through the coil L and outputs the amplified voltage as a detection signal S12. The detection signal S12 is a signal proportional to the current Ib flowing through the coil L and is substantially proportional to the magnetic field due to the coil L. Since the magnetic field due to the coil L is controlled so as to cancel out the component in the X direction of the magnetic field that is exerted on the magnetoresistance effect elements M1 to M4 by the current to be measured Is, the magnetic field due to the coil L is substantially proportional to the current to be measured Is. Thus, the detection signal S12 is a signal substantially proportional to the current to be measured Is.

The dotted line to which an arrow is attached in FIG. 3 indicates the center of the distribution of the current to be measured Is. As illustrated in FIG. 3, the center of the distribution of the current to be measured Is is located on the Z2 side of the first imaginary flat plane P11 in the first conductor portion 11A. However, as the current to be measured Is passes through the third conductor portion 13A disposed between the first bent portion 14A and the first conductor portion 11A, the center of the distribution of the current to be measured Is shifts in the Z1 direction. Thus, the center of the distribution CP of the current to be measured Is flowing from the first bent portion 14A to the second conductor portion 12 is substantially in the first imaginary flat plane P11. As a result, a magnetic field Hs due to the current to be measured Is flowing through the second conductor portion 12 spreads around the center of the distribution CP of the current to be measured Is in an elliptical shape, and the direction of the magnetic field Hs is perpendicular to the first imaginary flat plane P11. A similar situation occurs when the current to be measured Is flows from the first conductor portion 11B to the second conductor portion 12.

As described above, in the current sensor according to the present embodiment, while the first conductor portions 11A and 11B are separated from the first imaginary flat plane P11, the magnetoresistance effect elements M1 to M4, which detect the magnetic field due to the current to be measured Is flowing through the first conductor portions 11A and 11B, are located on the first imaginary flat plane P11, and the second conductor portion 12 intersects the first imaginary flat plane P11. The current to be measured Is, which bends in the Y direction at the first bent portions 14A and 14B, flows through the first conductor portions 11A and 11B via the third conductor portions 13A and 13B, which intersect the first imaginary flat plane P11. Accordingly, the center of the distribution of the current to be measured Is, which is separated from the first imaginary flat plane P11 in the first conductor portions 11A and 11B, passes through the third conductor portions 13A and 13B and thus reaches the vicinity of the first imaginary flat plane P11. Since the center of the distribution of the current to be measured Is reaches the vicinity of the first imaginary flat plane P11 in the third conductor portions 13A and 13B, the flow of the current to be measured Is, which bends at the first bent portions 14A and 14B, is centered around the first imaginary flat plane P11 in the second conductor portion 12. Consequently, the direction of the magnetic field Hs due to the current to be measured Is flowing through the second conductor portion 12 is perpendicular to the first imaginary flat plane P11 and substantially perpendicular to the influence-on-sensitivity directions of the magnetoresistance effect elements M1 to M4. Accordingly, the magnetic field Hs due to the current to be measured Is flowing through the second conductor portion 12 is unlikely to affect the sensitivity of the magnetoresistance effect elements M1 to M4. In summary, the effect that is exerted on the measurement sensitivity by the magnetic field Hs due to the current to be measured Is flowing along the bent path can effectively be reduced.

In the current sensor according to the present embodiment, the third conductor portion 13A runs along the second imaginary flat plane P12A, which is perpendicular to the first imaginary flat plane P11 and contains the first imaginary straight line L11A, and the current to be measured Is flows parallel to the second imaginary flat plane P12A in the third conductor portion 13A. In this configuration, as the path of the current to be measured Is in the third conductor portion 13A is shortened, the resistance of the third conductor portion 13A is reduced. A similar situation occurs for the case of the third conductor portion 13B, which is a symmetrical portion to the third conductor portion 13A. Consequently, the resistance of the conductor 10 is reduced, and the loss due to the resistance can be reduced.

In the current sensor according to the present embodiment, the cross section perpendicular to the X direction at the portion connecting the second conductor portion 12 and the first bent portion 14A, the cross section perpendicular to the Y direction at the portion connecting the first bent portion 14A and the third conductor portion 13A, and the cross section of the second conductor portion 12, the cross section being perpendicular to the X direction, are equal to each other in shape and size and uniform. In addition, similarly to the above description, the conductor 10 also has a cross section that is equal in shape and size and uniform in the portion ranging from the second conductor portion 12 to the third conductor portion 13A. This configuration facilitates processing of bending the conductor 10 at the first bent portions 14A and 14B, and process accuracy is improved. Further, the current to be measured Is, which bends to the second conductor portion 12 at the first bent portions 14A and 14B, is likely to flow parallel to the second imaginary straight line L12 (in the X direction). Consequently, as the direction of the magnetic field Hs is likely to be parallel to the direction perpendicular to the first imaginary flat plane P11 (in the Z direction), the effect that is exerted on the measurement sensitivity by the magnetic field Hs can be reduced more effectively.

According to the present embodiment, the magnetoresistance effect elements M1 to M4 are contained in an IC package of the magnetic sensor 50, and the IC package of the magnetic sensor 50 is disposed between the first conductor portion 11A and the first conductor portion 11B when viewed in the Z direction. A current sensor can be downsized by using this configuration.

Second Embodiment

Figure 5:
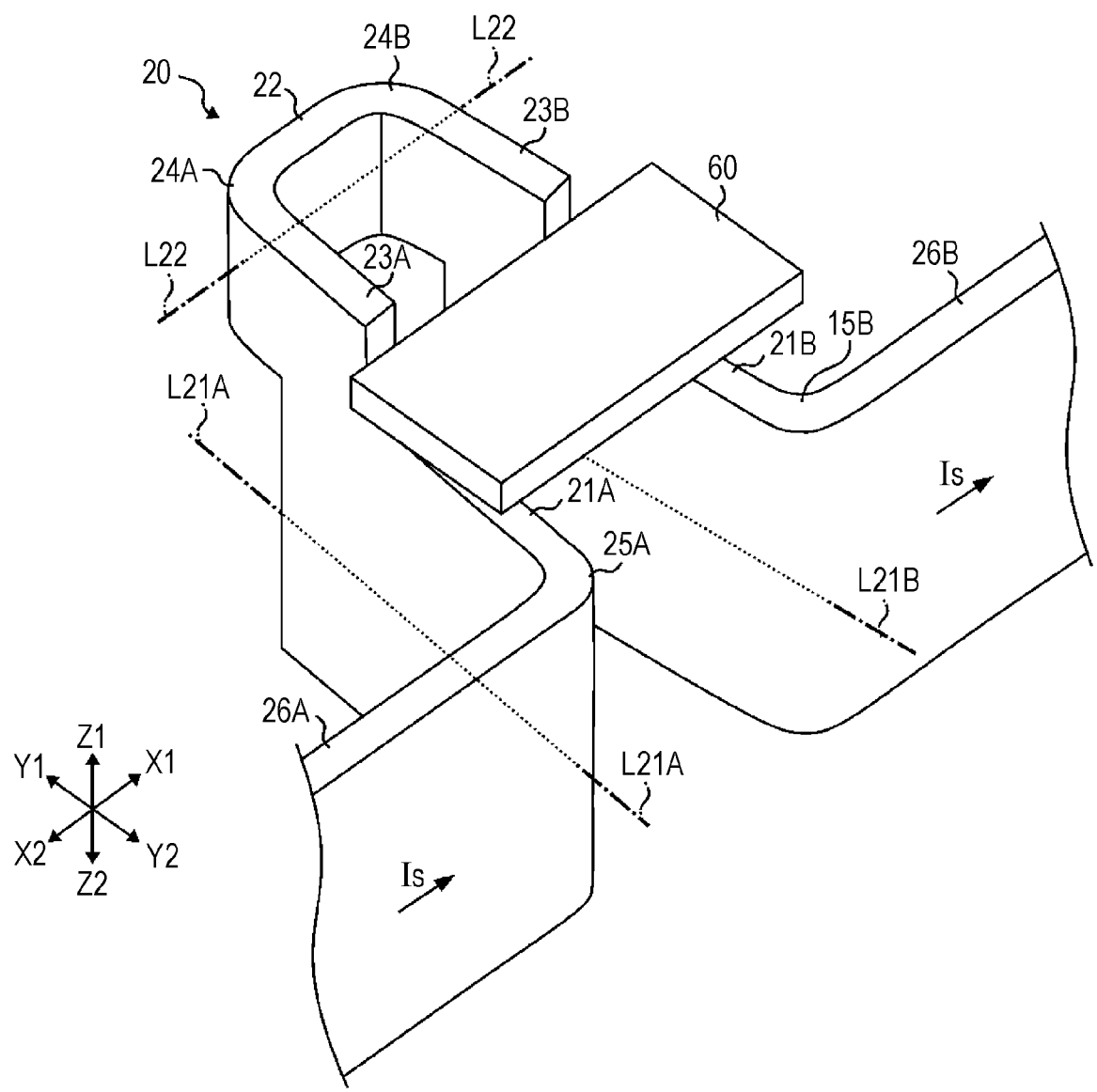
FIG. 5 illustrates an example configuration of a current sensor according to a second embodiment of the present invention.
Figure 6:
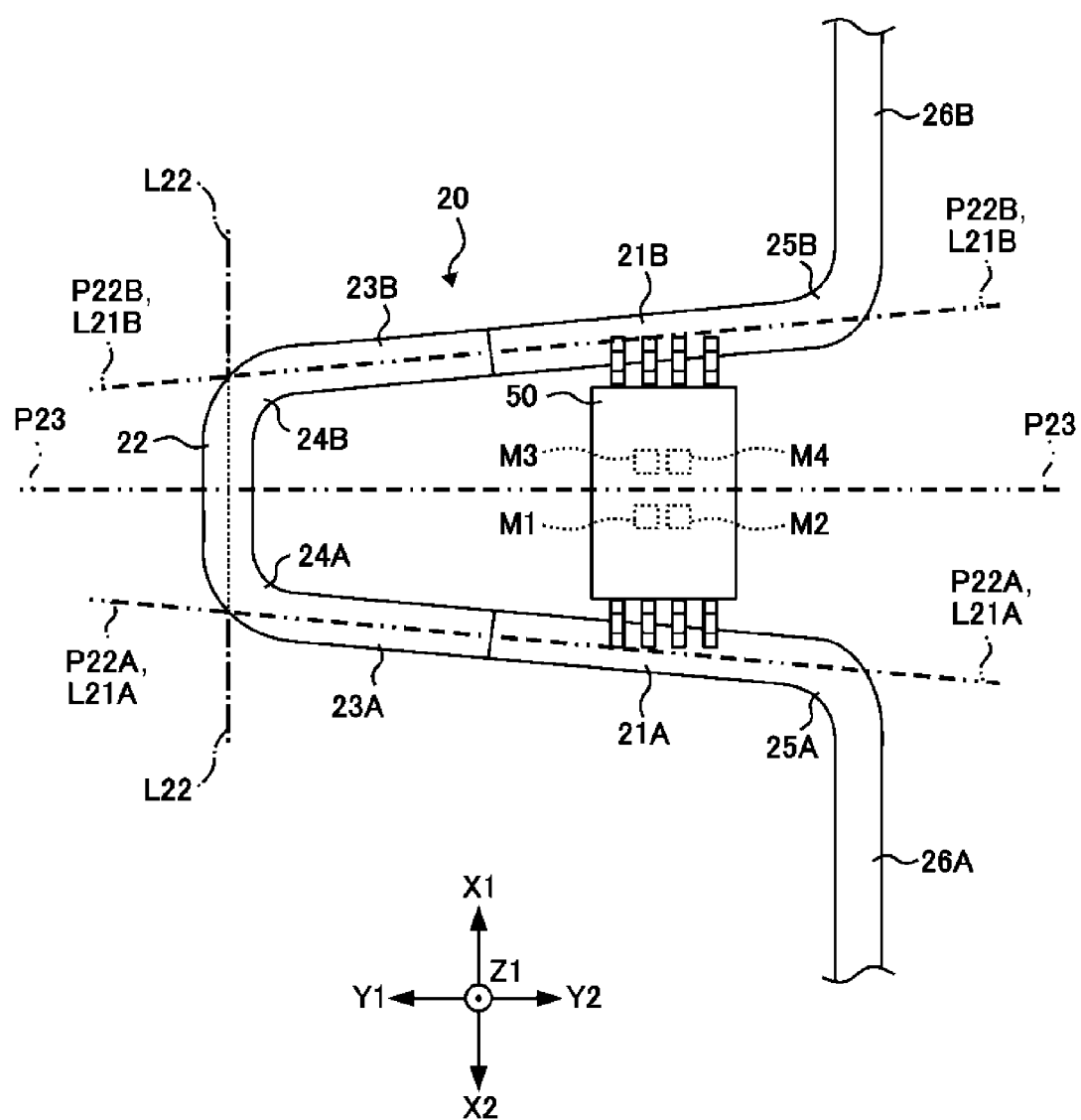
FIG. 6 is a plan view of the current sensor illustrated in FIG. 5.
Figure 7:
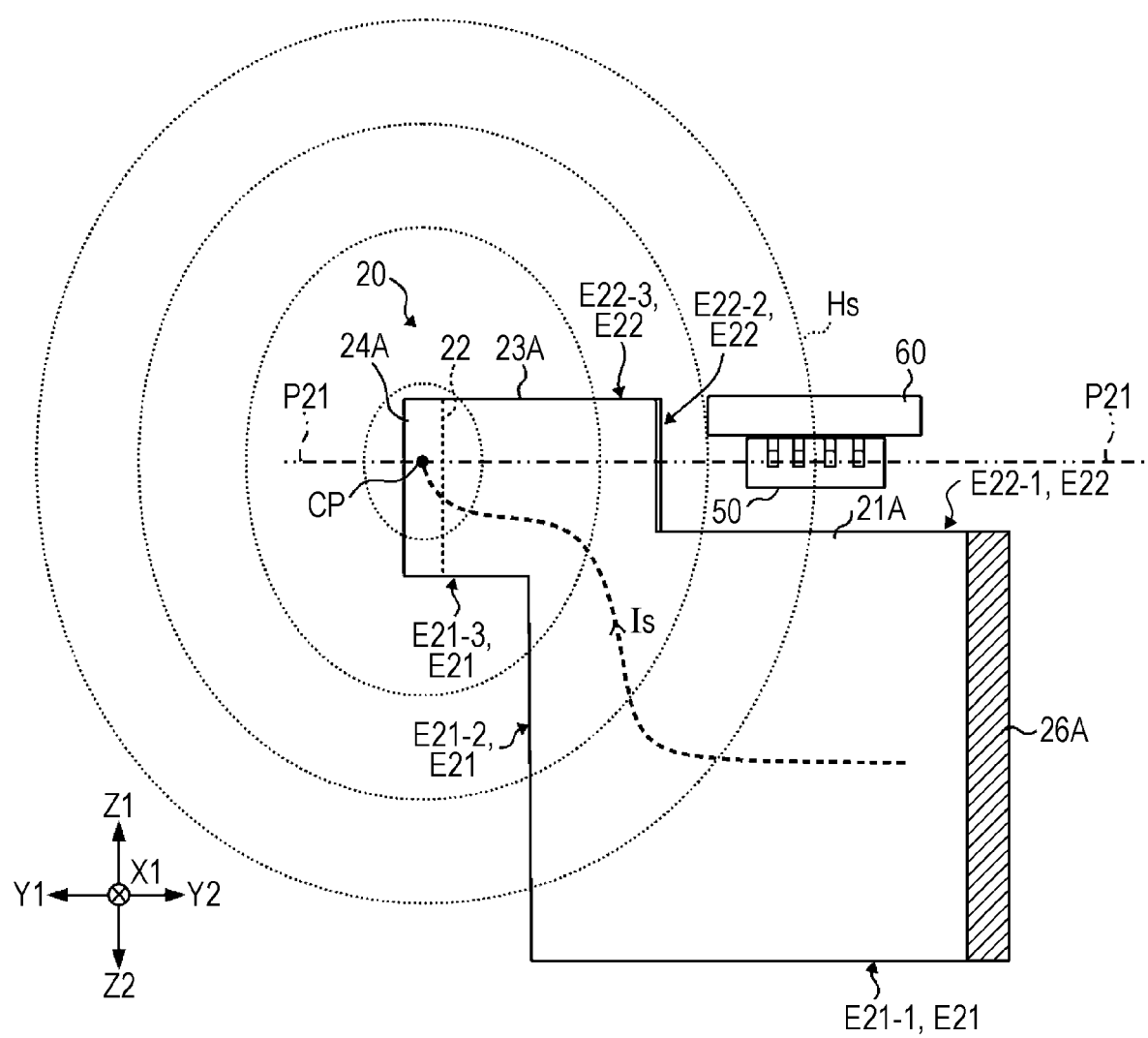
FIG. 7 is a front view of the current sensor illustrated in FIG. 5.

Next, a second embodiment of the present invention will be described. FIG. 5 illustrates an example configuration of a current sensor according to the second embodiment of the present invention. FIG. 6 is a plan view of the current sensor illustrated in FIG. 5 when viewed from the Z1 side. FIG. 7 is a front view of the current sensor illustrated in FIG. 5 when viewed from the X2 side. However, in FIG. 6, a circuit board 60 is omitted from the illustration.

The current sensor according to the second embodiment includes a magnetic sensor 50 and the circuit board 60, which are similar to those included in the current sensor according to the first embodiment, and a conductor 20. Similarly to the conductor 10 described above, the conductor 20 is formed by bending a plate-like material into a U shape and has a plane symmetrical form. The conductor 10 and the conductor 20 have many features in common, and different features are mainly described below.

The first conductor portion 11A, the first conductor portion 11B, the second conductor portion 12, the third conductor portion 13A, the third conductor portion 13B, the first bent portion 14A, the first bent portion 14B, the second bent portion 15A, the second bent portion 15B, the fourth conductor portion 16A, and the fourth conductor portion 16B in the conductor 10 correspond to a first conductor portion 21A, a first conductor portion 21B, a second conductor portion 22, a third conductor portion 23A, a third conductor portion 23B, a first bent portion 24A, a first bent portion 24B, a second bent portion 25A, a second bent portion 25B, a fourth conductor portion 26A, and a fourth conductor portion 26B, respectively, in the conductor 20. In short, each portion in the conductor 20 denoted by a numeral corresponds to a portion in the conductor 10 denoted by a numeral whose tens digit is changed from "2" to "1".

Further, a first imaginary straight line L21A, a first imaginary straight line L21B, a second imaginary straight line L22, a first imaginary flat plane P21, a second imaginary flat plane P22A, a second imaginary flat plane P22B, and a third imaginary flat plane P23 in FIGS. 5 to 7 correspond to the first imaginary straight line L11A, the first imaginary straight line L11B, the second imaginary straight line L12, the first imaginary flat plane P11, the second imaginary flat plane P12A, the second imaginary flat plane P12B, and the third imaginary flat plane P13, respectively, in FIGS. 1 to 3. In short, each imaginary straight line or each imaginary flat plane in FIGS. 5 to 7 denoted by a numeral corresponds to an imaginary straight line or an imaginary flat plane in FIGS. 1 to 3 denoted by a numeral whose tens digit is changed from "2" to "1".

In the current sensor according to the first embodiment, the magnetic sensor 50 is disposed on the Z1 side surface of the circuit board 60, as illustrated in FIG. 1, but, in the current sensor according to the second embodiment, the magnetic sensor 50 is disposed on the Z2 side surface of the circuit board 60, as illustrated in FIG. 7.

In addition, while bending angles at the first bent portions 14A and 14B are approximately a right angle, as illustrated in FIG. 2, in the current sensor according to the first embodiment, bending angles at the first bent portions 24A and 24B are an obtuse angle slightly larger than a right angle, as illustrated in FIG. 6, in the current sensor according to the second embodiment.

A comparison between FIG. 1 and FIG. 5 reveals that the width of the second conductor portion 22, the width of the first bent portion 24A, and the width of the first bent portion 24B in the Z direction in the current sensor according to the second embodiment are narrower than the width of the second conductor portion 12, the width of the first bent portion 14A, and the width of the first bent portion 14B in the Z direction in the current sensor according to the first embodiment.

In FIG. 3, the conductor 10 in the current sensor according to the first embodiment has two edges (a first edge E11 and a second edge E12) separated from each other in the Z direction. The first edge E11 is an edge entirely separated from the first imaginary flat plane P11, and the second edge E12 is an edge having a portion that intersects the first imaginary flat plane P11. Specifically, the second edge E12 crosses the first imaginary flat plane P11 between the second edge E12-1 of the first conductor portions 11A and 11B and the second edge E12-2 of the third conductor portions 13A and 13B. On the other hand, in FIG. 7, the conductor 20 in the current sensor according to the second embodiment has two edges (a first edge E21 and a second edge E22) separated from each other in the Z direction. The first edge E21 is an edge separated from the first imaginary flat plane P21, and the second edge E22 is an edge that intersects the first imaginary flat plane P21.

A comparison between FIG. 3 and FIG. 7 reveals that, while the first edge E11 in the conductor 10 has every portion located at the same position in the Z direction, the first edge E21 of the first conductor portions 21A and 21B and the first edge E21 of the first bent portion 24A, the first bent portion 24B, and the second conductor portion 22 are located at different positions in the Z direction in the conductor 20. Specifically, the first edge E21 (E21-3) of the first bent portion 24A, the first bent portion 24B, and the second conductor portion 22 is located closer than the first edge E21 (E21-1) of the first conductor portions 21A and 21B to the first imaginary flat plane P21. Such a difference in the edge position leads to narrower widths of the second conductor portion 22, the first bent portion 24A, and the first bent portion 24B in the Z direction in the current sensor according to the second embodiment.

As described above, in the current sensor according to the present embodiment, since the first edge E21-3 of the first bent portion 24A, the first bent portion 24B, and the second conductor portion 22 is located closer than the first edge E21-1 of the first conductor portions 21A and 21B to the first imaginary flat plane P21, the width of the first bent portion 24A, the width of the first bent portion 24B, and the width of the second conductor portion 22 in the Z direction are narrower. As this configuration causes the center of the distribution CP of the current to be measured Is flowing through the second conductor portion 22 to lie in an appropriate region around the first imaginary flat plane P21, the magnetic field Hs due to the current to be measured Is flowing through the second conductor portion 22 is likely to cross the first imaginary flat plane P21 at right angles. In addition, the narrower widths of the first bent portion 24A, the first bent portion 24B, and the second conductor portion 22 in the Z direction cause the position of the first imaginary flat plane P21 to shift in the Z1 direction. Consequently, as revealed by a comparison between FIG. 3 and FIG. 7, the widths of the first conductor portions 21A and 21B in the Z direction relative to the width of the conductor 20 as a whole in the Z direction can be increased. Accordingly, the resistance of the conductor 20 can be reduced.

Third Embodiment

Figure 8:
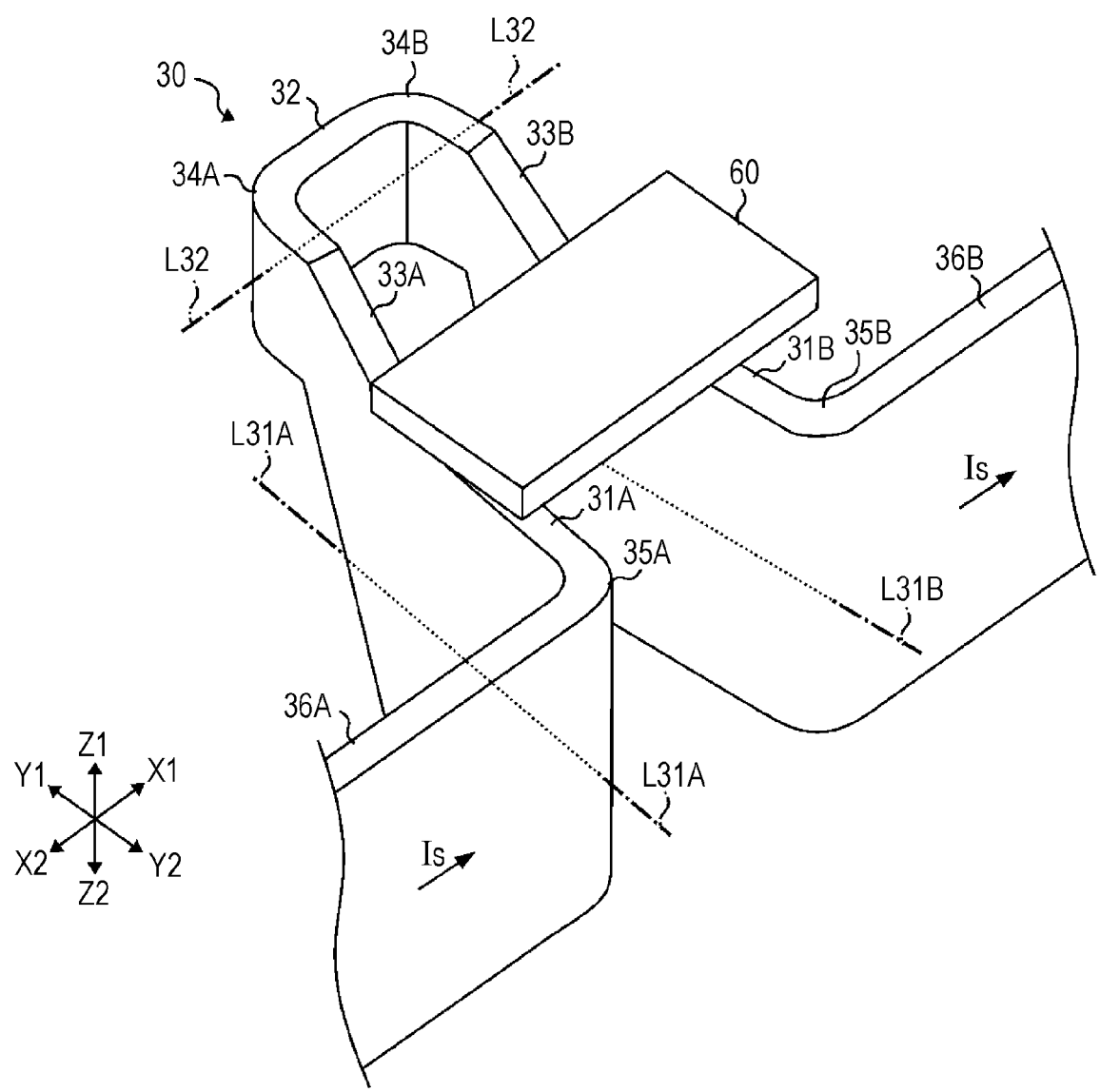
FIG. 8 illustrates an example configuration of a current sensor according to a third embodiment of the present invention.
Figure 9:
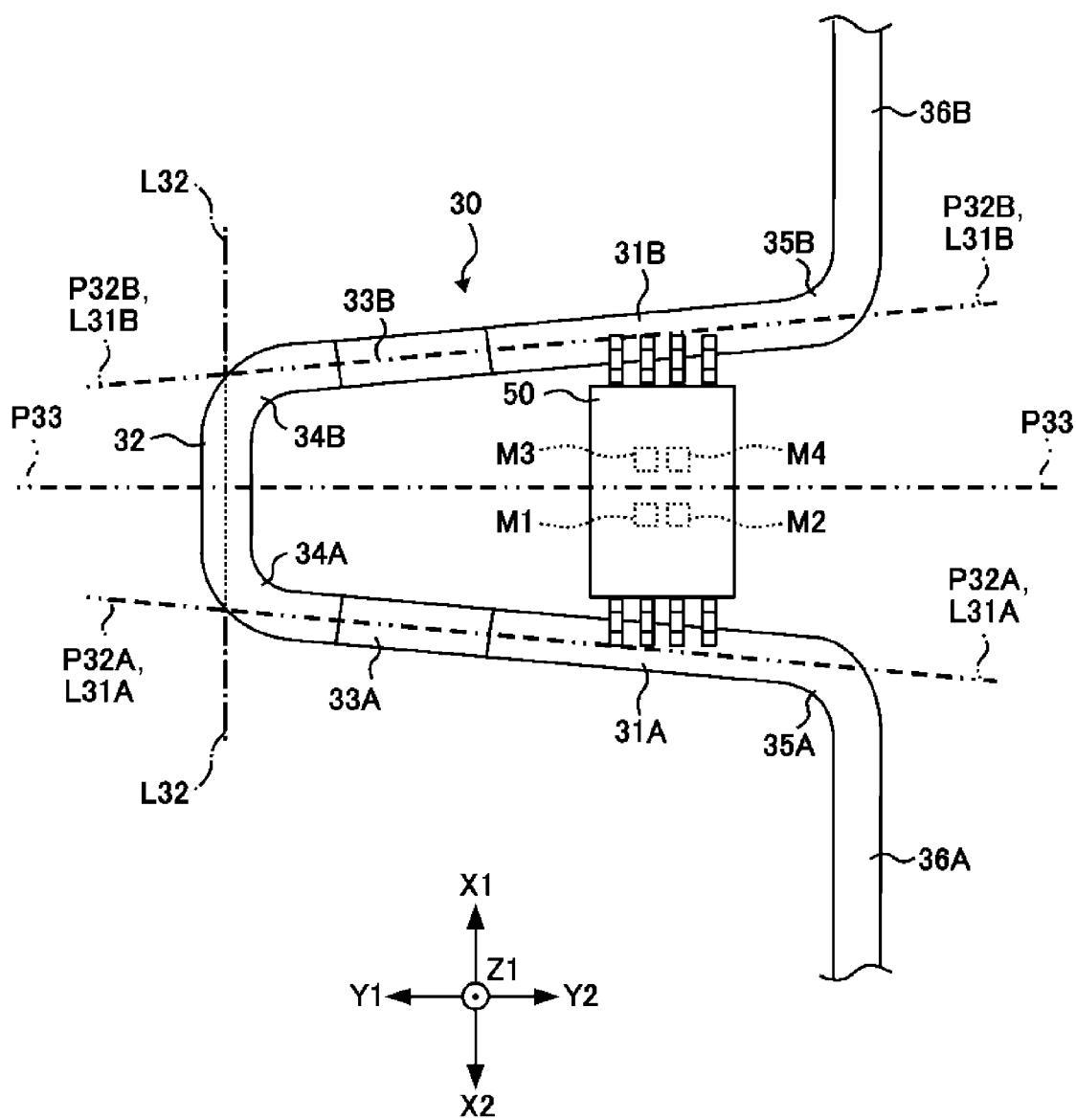
FIG. 9 is a plan view of the current sensor illustrated in FIG. 8.
Figure 10:
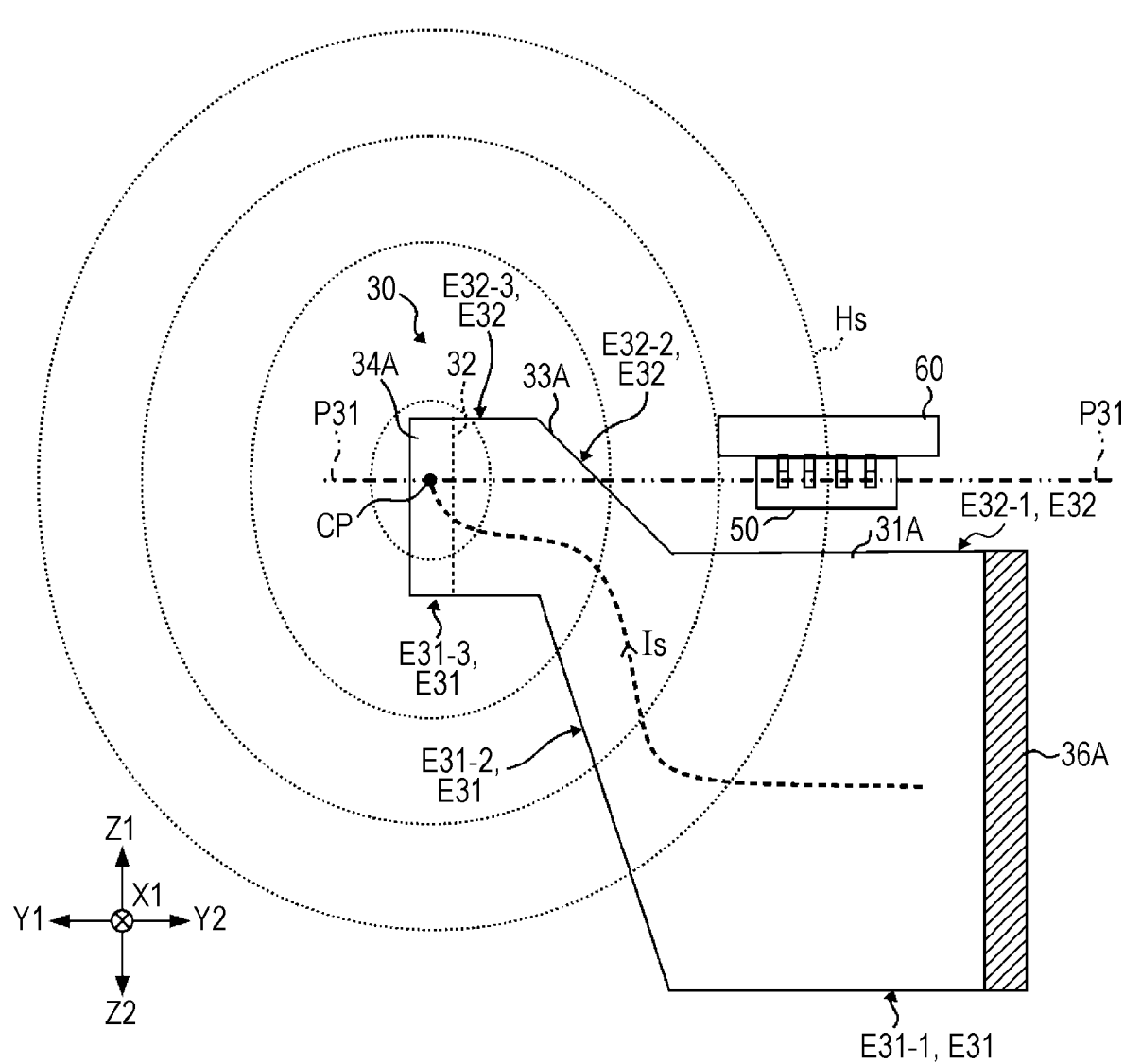
FIG. 10 is a front view of the current sensor illustrated in FIG. 8.
Figure 11:
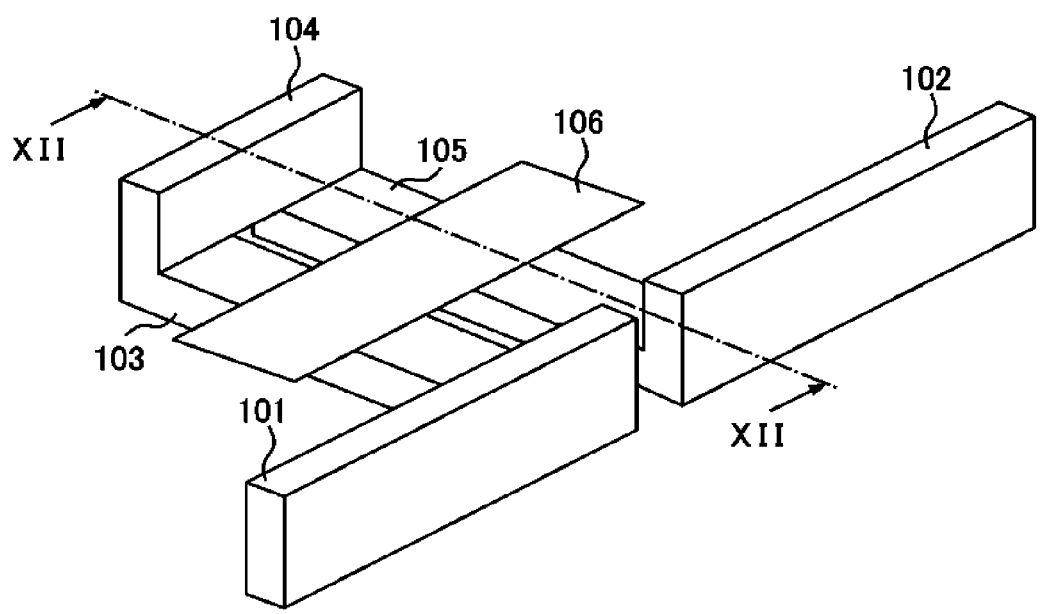
FIG. 11 illustrates a configuration of a current sensor known in the related art.
Figure 12:
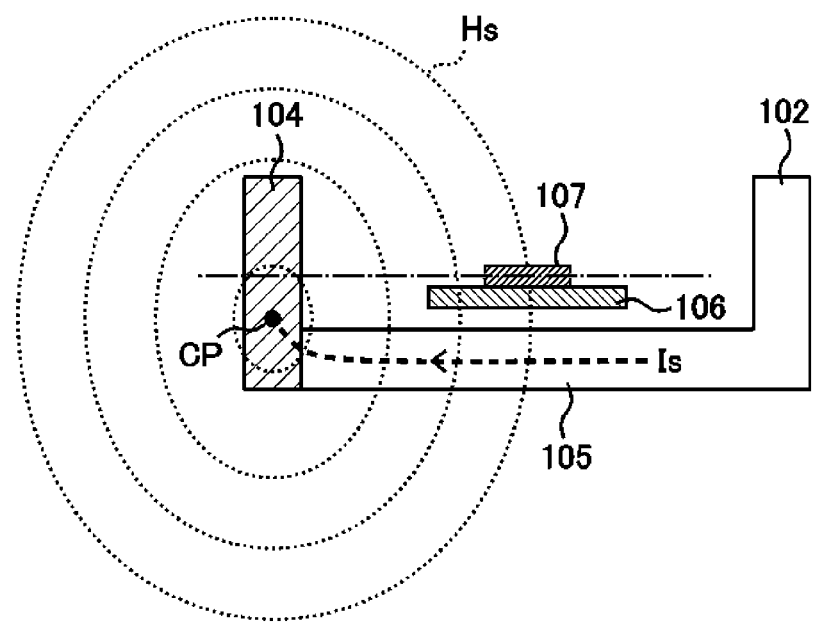
FIG. 12 is a cross-sectional view taken along line XII-XII of FIG. 11.

Next, a third embodiment of the present invention will be described. FIG. 8 illustrates an example configuration of a current sensor according to the third embodiment of the present invention. FIG. 9 is a plan view of the current sensor illustrated in FIG. 8 when viewed from the Z1 side. FIG. 10 is a front view of the current sensor illustrated in FIG. 8 when viewed from the X2 side. However, in FIG. 9, a circuit board 60 is omitted from the illustration.

The current sensor according to the third embodiment includes a magnetic sensor 50 and the circuit board 60, which are similar to those included in the current sensor according to the second embodiment, and a conductor 30. Similarly to the conductors 10 and 20 described above, the conductor 30 is formed by bending a plate-like material into a U shape and has a plane symmetrical form. The conductor 20 and the conductor 30 have many features in common, and different features are mainly described below.

The first conductor portion 21A, the first conductor portion 21B, the second conductor portion 22, the third conductor portion 23A, the third conductor portion 23B, the first bent portion 24A, the first bent portion 24B, the second bent portion 25A, the second bent portion 25B, the fourth conductor portion 26A, and the fourth conductor portion 26B in the conductor 20 correspond to a first conductor portion 31A, a first conductor portion 31B, a second conductor portion 32, a third conductor portion 33A, a third conductor portion 33B, a first bent portion 34A, a first bent portion 34B, a second bent portion 35A, a second bent portion 35B, a fourth conductor portion 36A, and a fourth conductor portion 36B, respectively, in the conductor 30. In short, each portion in the conductor 30 denoted by a numeral corresponds to a portion in the conductor 20 denoted by a numeral whose tens digit is changed from "3" to "2".

Further, a first imaginary straight line L31A, a first imaginary straight line L31B, a second imaginary straight line L32, a first imaginary flat plane P31, a second imaginary flat plane P32A, a second imaginary flat plane P32B, and a third imaginary flat plane P33 in FIGS. 8 to 10 correspond to the first imaginary straight line L21A, the first imaginary straight line L21B, the second imaginary straight line L22, the first imaginary flat plane P21, the second imaginary flat plane P22A, the second imaginary flat plane P22B, and the third imaginary flat plane P23, respectively, in FIGS. 5 to 7. In short, each imaginary straight line or each imaginary flat plane in FIGS. 8 to 10 denoted by a numeral corresponds to an imaginary straight line or an imaginary flat plane in FIGS. 5 to 7 denoted by a numeral whose tens digit is changed from "3" to "2".

In the current sensor according to the second embodiment, as illustrated in FIG. 7, the edge position in the Z direction changes discontinuously at the first edge E21-2 of the third conductor portions 23A and 23B, but, in the current sensor according to the third embodiment, as illustrated in FIG. 10, the edge position in the Z direction changes continuously in the first edge E31-2 of the third conductor portions 33A and 33B. Specifically, the distance between a point on the first edge E31-2 of the third conductor portions 33A and 33B and the first edge E31-3 of the first bent portions 34A and 34B in the Z direction decreases as the point approaches the first bent portions 34A and 34B.

A comparison between FIG. 7 and FIG. 10 reveals that the corner on the Z2 side and on the Y1 side where the amount of current is considered to be relatively small in the distribution of the current to be measured Is in the third conductor portions 23A and 23B is cut for the third conductor portions 33A and 33B. Consequently, the amount of material used for the conductor 10 can be reduced without significantly increasing the resistance of the conductor 10, which leads to weight reduction of a device.

Further, in the current sensor according to the second embodiment, as illustrated in FIG. 7, the edge position in the Z direction changes discontinuously at the second edge E22-2 of the third conductor portions 23A and 23B, but, in the current sensor according to the third embodiment, as illustrated in FIG. 10, the edge position in the Z direction changes continuously in the second edge E32-2 of the third conductor portions 33A and 33B. Specifically, the distance between a point on the second edge E32-2 of the third conductor portions 33A and 33B and the second edge E32-3 of the first bent portions 34A and 34B in the Z direction decreases as the point approaches the first bent portions 34A and 34B.

A comparison between FIG. 7 and FIG. 10 reveals that the corner on the Z1 side and on the Y2 side where the amount of current is considered to be relatively small in the distribution of the current to be measured Is in the third conductor portions 23A and 23B is cut for the third conductor portions 33A and 33B. Consequently, the amount of material used for the conductor 10 can be reduced without significantly increasing the resistance of the conductor 10, which leads to weight reduction of a device.

Some embodiments of the present invention have been described as above, but the present invention is not limited to the embodiments described above and includes various different variations.

For example, the shapes and sizes of the conductors in the embodiments have been described for illustrative purposes only, and the present invention is not limited to these configurations.

In the example in FIG. 10, the edge positions of the first edge E31-2 and the second edge E32-2 continuously change in the Z direction, but the present invention is not limited to this example. Specifically, a point on the edges of the third conductor portions may change the position in the Z direction in a stepwise manner as the point approaches the bent portions.

The configuration of the magnetic sensor is not limited to the full bridge circuit of the magnetoresistance effect elements illustrated in FIG. 4, and, for example, a half bridge circuit using two magnetoresistance effect elements may be adopted.

Although the examples in which a conductor is bent at two bent portions and formed into a U shape have been described in the embodiments described above, any number of bent portions may be adopted in the present invention, and the present invention may be applied, for example, to a case where only one bent portion is adopted.

What is claimed is:

1. A current sensor comprising:
a conductor through which a current to be measured flows; and
a magnetoresistance effect element located on a first imaginary flat plane that is parallel to a first imaginary straight line and a second imaginary straight line,
the conductor including:
a first conductor portion that runs along the first imaginary straight line and is separated from the first imaginary flat plane, and through which the current to be measured flows parallel to the first imaginary straight line,
a second conductor portion that runs along the second imaginary straight line and intersects the first imaginary flat plane, and through which the current to be measured flows parallel to the second imaginary straight line,
a bent portion that is disposed along a current path between the second conductor portion and the first conductor portion and that is bent in a first direction parallel to the first imaginary straight line from a second direction parallel to the second imaginary straight line, and
a third conductor portion that is disposed along a current path between the bent portion and the first conductor portion,
the magnetoresistance effect element detecting a magnetic field due to the current to be measured flowing through the first conductor portion,
a direction of a magnetic field to which the magnetoresistance effect element has sensitivity and a direction of a magnetic field by which the sensitivity of the magnetoresistance effect element is influenced being parallel to the first imaginary flat plane, and
the third conductor portion intersecting the first imaginary flat plane, wherein:
the third conductor portion is located on a second imaginary flat plane that is perpendicular to the first imaginary flat plane and that contains the first imaginary straight line and the current to be measured flows parallel to the second imaginary flat plane through the third conductor portion;
a cross section perpendicular to the second direction at a portion connecting the bent portion and the second conductor portion, a cross section perpendicular to the first direction at a portion connecting the bent portion and the third conductor portion, and a cross section of the second conductor portion, the cross section being perpendicular to the second direction, are equal to each other in shape and size and uniform, and
a width of the bent portion and a width of the second conductor portion in a third direction perpendicular to the first imaginary flat plane are equal to each other and uniform.

2. The current sensor according to claim 1,
wherein, of two edges of the conductor, which are separated in the third direction, an edge that is entirely separated from the first imaginary flat plane is referred to as a first edge, and
the first edge is closer to the first imaginary flat plane in the bent portion and in the second conductor portion than in the first conductor portion.

3. The current sensor according to claim 2,
wherein a distance between a point on the first edge of the third conductor portion and the first edge of the bent portion in the third direction decreases as the point approaches the bent portion.

4. The current sensor according to claim 1,
wherein, of two edges of the conductor, which are separated in the third direction, an edge having a portion intersecting the first imaginary flat plane is referred to as a second edge, and
a distance between a point on the second edge of the third conductor portion and the second edge of the bent portion in the third direction decreases as the point approaches the bent portion.

5. A current sensor comprising:
a conductor through which a current to be measured flows; and
a magnetoresistance effect element located on a first imaginary flat plane that is parallel to a first imaginary straight line and a second imaginary straight line,
the conductor including:
a first conductor portion that runs along the first imaginary straight line and is separated from the first imaginary flat plane, and through which the current to be measured flows parallel to the first imaginary straight line,
a second conductor portion that runs along the second imaginary straight line and intersects the first imaginary flat plane, and through which the current to be measured flows parallel to the second imaginary straight line,
a bent portion that is disposed along a current path between the second conductor portion and the first conductor portion and that is bent in a first direction parallel to the first imaginary straight line from a second direction parallel to the second imaginary straight line, and
a third conductor portion that is disposed along a current path between the bent portion and the first conductor portion, the magnetoresistance effect element detecting a magnetic field due to the current to be measured flowing through the first conductor portion, a direction of a magnetic field to which the magnetoresistance effect element has sensitivity and a direction of a magnetic field by which the sensitivity of the magnetoresistance effect element is influenced being parallel to the first imaginary flat plane, and wherein:

the third conductor portion intersects the first imaginary flat plane;

the conductor has a plane symmetrical form about a third imaginary flat plane that passes through the center of the second conductor portion and that is perpendicular to the first imaginary flat plane, and each of the bent portion, the third conductor portion, and the first conductor portion has two parts arranged symmetrically about the third imaginary flat plane; and the current sensor includes at least one pair of the magnetoresistance effect elements disposed symmetrically about the third imaginary flat plane.

6. The current sensor according to claim 5, wherein the at least one pair of the magnetoresistance effect elements is contained in a package, and the package is disposed between the two parts of the first conductor portion when viewed in a direction perpendicular to the first imaginary flat plane.

7. A current sensor comprising:
a conductor through which a current to be measured flows; and
a magnetoresistance effect element located on a first imaginary flat plane that is parallel to a first imaginary straight line and a second imaginary straight line, the conductor including:
a first conductor portion that runs along the first imaginary straight line and is separated from the first imaginary flat plane, and through which the current to be measured flows parallel to the first imaginary straight line,
a second conductor portion that runs along the second imaginary straight line and intersects the first imaginary flat plane, and through which the current to be measured flows parallel to the second imaginary straight line,
a bent portion that is disposed along a current path between the second conductor portion and the first conductor portion and that is bent in a first direction parallel to the first imaginary straight line from a second direction parallel to the second imaginary straight line, and
a third conductor portion that is disposed along a current path between the bent portion and the first conductor portion,
the magnetoresistance effect element detecting a magnetic field due to the current to be measured flowing through the first conductor portion,
a direction of a magnetic field to which the magnetoresistance effect element has sensitivity and a direction of a magnetic field by which the sensitivity of the magnetoresistance effect element is influenced being parallel to the first imaginary flat plane, and wherein:
the third conductor portion intersects the first imaginary flat plane; and
the conductor is bent at an obtuse angle at the bent portion.

* * * * *